United States Patent [19]

O'Loughlin et al.

[11] Patent Number: 5,567,995
[45] Date of Patent: Oct. 22, 1996

[54] MULTI WINDING SPIRAL GENERATOR

[75] Inventors: James P. O'Loughlin, Placitas; Steve E. Calico, Albuquerque, both of N.M.

[73] Assignee: The United States of America as represented by the Secretary of the Air Force, Washington, D.C.

[21] Appl. No.: 326,623

[22] Filed: Oct. 20, 1994

[51] Int. Cl.⁶ .................................................. H03K 3/00
[52] U.S. Cl. ...................... 307/109; 307/106; 361/301.5; 361/306.3
[58] Field of Search ................... 361/301.5, 530, 361/531, 297, 306.3, 308.1, 310, 313; 327/291, 544; 307/106, 108, 109; 378/103; 333/24 C

[56] References Cited

U.S. PATENT DOCUMENTS

| | | | |
|---|---|---|---|
| 2,919,390 | 12/1959 | Robinson | 361/301.5 |
| 3,322,976 | 5/1967 | Blank | 361/301.5 |
| 3,681,604 | 8/1972 | Criswell et al. | 307/106 |
| 3,710,211 | 1/1973 | Behn | 361/306.3 |
| 4,140,917 | 2/1979 | Weiner | 307/106 |
| 4,217,468 | 8/1980 | Rice | 178/116 |
| 4,379,982 | 4/1983 | Proud | 307/106 |
| 4,484,085 | 11/1984 | Fallier, Jr. et al. | 307/108 |
| 4,507,567 | 3/1985 | Lawson | 307/106 |
| 4,608,521 | 8/1986 | Fallier | 307/106 |
| 4,717,834 | 1/1988 | Levy | 307/106 |
| 4,803,378 | 2/1989 | Richardson | 307/108 |
| 4,818,892 | 4/1989 | Oohashi et al. | 307/106 |
| 4,996,495 | 2/1991 | Birx | 328/65 |
| 5,118,969 | 6/1992 | Ikezi et al. | 307/419 |

*Primary Examiner*—Jonathan Wysocki
*Assistant Examiner*—Peter Ganjoo
*Attorney, Agent, or Firm*—William G. Auton

[57] ABSTRACT

A multiwinding spiral generator is capable of delivering any predetermined amount of energy at any predetermined voltage. The multiple spiral combines three components into a single component. The multiple spiral functions as the primary low voltage energy store, the voltage step-up means, and the high voltage energy store. The duplication of these functions by a single multiple spiral potentially offers a factor of three in reducing the size, weight, volume, and cost compared to the conventional pulse power conditioning apparatus.

12 Claims, 8 Drawing Sheets

TYPE A

TYPE B

TYPE C

TYPE D

TYPE F

LEFT SANDWICH RIGHT SANDWICH

MULTI WINDING SPIRAL GENERATOR

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to power generators and pulse generators, and more specifically the invention pertains to a multiwinding spiral generator which is capable of delivering any predetermined amount of energy at any predetermined voltage.

One of the most common uses of high voltage capacitive energy storage is in pulse power conditioning. A capacitive energy storage pulse power conditioner consists of a power source, a means of charging a pulse forming line (PFL) or network (PFN) to a high voltage, a means of switching the charged pulse forming line or network into the load. The power source is a d.c. power supply typically on the order of 10,000 volts. The means of charging the PFL or PFN is a primary storage capacitor, a primary switch and a step-up transformer. The PFL or PFN is a capacitive energy store. In the case of a PFL the device is simply a transmission line of coaxial, parallel plate or other geometry which is a distributed parameter configuration. In the case of a PFN the device is configured from lumped parameter capacitive and inductive elements. There are numerous configurations including the famous Guillemin canonical forms as well as numerous other configurations. The common characteristic among all capacitive energy storage PFN's is the axiomatic fact that the energy is stored initially in the capacitive elements. The sequence of operation consists of the d.c. power supply charging the primary energy store; the primary energy store is then switched into the step-up transformer which transforms the primary energy to high voltage and stores it in the PFL/PFN. The next step is to close the output switch which connects the PFL/PFN to the load. The energy in the PFL/PFN is then delivered to the load in the form of a high voltage pulse. The characteristics of the pulse are determined by the PFL/PFN and the load.

The simple conventional spiral generator consists of a parallel plate transmission line, which has been rolled into a spiral with the inclusion of an additional strip of insulation thereby forming a pair of transmission lines, one is the active line and the other is the passive line. Thus a spiral is a capacitor which can rearrange itself upon command to a high voltage configuration. It is obvious that if one were able to configure practical spirals, given voltage and energy requirements, then they could be used in PFN's and other pulse power applications to advantage. The subject of this disclosure, the multiwinding spiral, can accomplish this objective. The advantage being that the high-voltage charging means could be eliminated because it is built into the spiral design.

The task of providing a compact and efficient means of processing large amounts of capacitive energy at high voltage for pulse power applications, is alleviated to some extent, by the systems described in the following U.S. Patents, the disclosures of which are incorporated herein by reference.

U.S. Pat. No. 5,118,969 issued to Ikezi et al;
U.S. Pat. No. 4,996,495 issued to Birx;
U.S. Pat. No. 4,818,892 issued to Oohashi et al; and
U.S. Pat. No. 4,803,378 issued to Richardson.

These references disclose different, pulse generation systems which have the limitations described above. None of the cited patents disclose a multiwinding spiral generator which is capable of delivering any predetermined amount of energy at any predetermined voltage. Also, none of the cited patents disclose combining three components into a multiple spiral, thereby functioning as the primary low voltage energy store, the voltage step-up means, and the high voltage energy store.

SUMMARY OF THE INVENTION

The invention includes a multiwinding spiral generator which is capable of delivering any predetermined amount of energy at any predetermined voltage. The multiple spiral combines the functions of three components into a single component. The multiple spiral functions as the primary low voltage energy store, the voltage step-up means, and the high voltage energy store. The duplication of these functions by a single multiple spiral potentially offers a factor of three in reducing the size, weight, volume, and cost compared to the conventional pulse power conditioning apparatus.

As described above, one embodiment of the invention contains a first group of conductor ribbons, a second group of conductor ribbons, a plurality of insulator ribbons, a voltage source and a switch. The first group of conductor ribbons consists of three or more metallic strips which are wound in a spiral and electrically connected along their edges along their entire lengths.

The second group of three conductor ribbons which are each individually sandwiched between one of the three conductor ribbons in the first group. The conductor ribbons in the second group all have a second edge along their entire lengths along which they are electrically connected.

The insulator ribbons are sandwiched between the first and second groups of conductor ribbons so that the ribbons act as both a capacitor and a transmission line. The voltage source charges the groups of conductor ribbons to a predetermined voltage. The switch causes the spiral to electrally reconfigure from a low voltage capacitive energy store into a high voltage capacitive energy store.

The uses of the multiwinding spiral generator are numerous in the field of pulse power conditioning. The invention provides for a unique simplification in the basic pulse power conditioning process.

In general, the pulse power conditioning process consists of converting low voltage energy from a power source to a high voltage while compressing the energy to a very short time duration.

The conventional pulse power conditioning process typically stores the energy in a capacitor bank at low voltage, then switches this energy through a voltage multiplication network such as a transformer to a high voltage pulse energy store from which it is transferred to the load.

The multiple spiral combines the functions of three of these components into a single component. The multiple spiral functions as the primary low voltage energy store, the voltage step-up means and the high voltage energy store. The duplication of these functions by a single multiple spiral potentially offers a factor of three reduction in size, weight, volume and cost compared to the conventional pulse power conditioning apparatus. Specific uses include: radar transmitters, pulsed electric lasers, microwave weapons, and any other high voltage/high energy pulsed electrical devices.

The invention is of greater value as the pulse energy increases. The size, weight and cost of energy storage is proportional to the energy. Since one multiple spiral replaces both the low voltage and high voltages energy store, there is an inherent factor of two savings. In addition, the multiple spiral replaces the voltage step-up transformer, which is also significant.

It is the objective of the invention to provide a compact and efficient means of processing large amounts of capacitive energy at high voltage for pulse power applications. The invention accomplishes this by removing the design constraints which previously limited the use of the spiral generator to low values of energy.

It is another objective of the invention to provide a design approach for spiral generators to accommodate any required amount of energy at any required voltage and still maintains an optimum configuration.

These objectives together with other objectives, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is a multiwinding spiral generator which is capable of delivering any predetermined amount of energy at any predetermined voltage and also maintains a highly utilized geometric volume.

Heretofore, the simple winding spiral generator was capable of delivering a very low and limited range of energy to a high voltage load. The reasons for this limitation is discussed in detail below.

Figure 1:
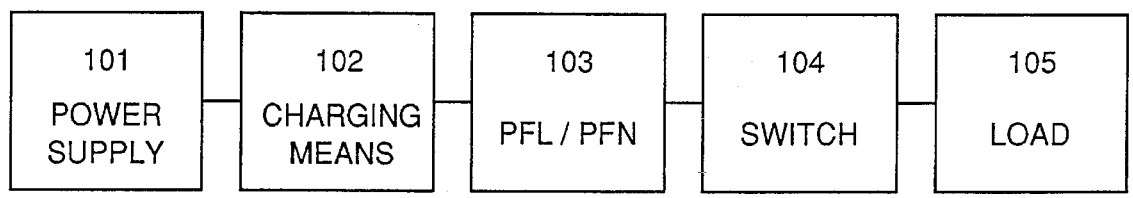
FIG. 1 is a block diagram of a high voltage pulse power system.
Figure 2:
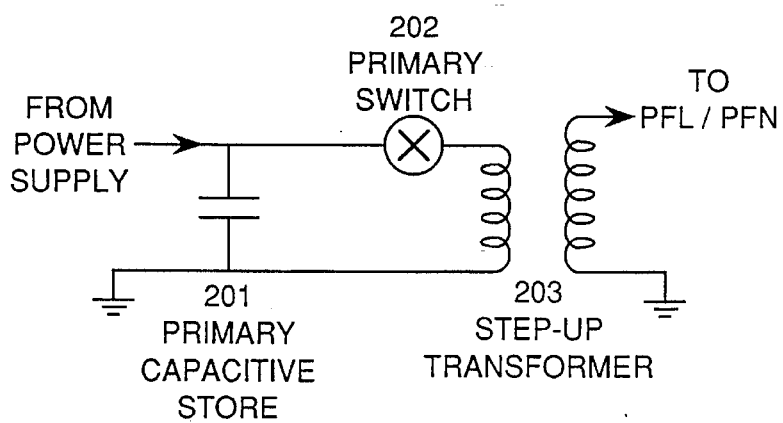
FIG. 2 is a schematic of a charging circuit, as used in FIG. 1.

The reader's attention is now directed towards FIG. 1 which is a prior art approach to a high voltage pulse power conditioning using capacitive energy storage. The system consists of a power source 101, a means of charging 102 a pulse forming line (PFL) or network (PFN) 103 to a high voltage, a means of switching 104 the charged pulse forming line or network into the load 105. The power source is a d.c. power supply typically on the order of 10,000 volts. The means of charging the PFL or PFN is shown in more detail in FIG. 2. The charging means consists of a primary storage capacitor 201, a primary switch 202 and a step-up transformer 203. The PFL or PFN is a capacitive energy store. In the case of a PFL the device is simply a transmission line of coaxial, parallel plate or other geometry which is a distributed parameter configuration.

Figure 3:
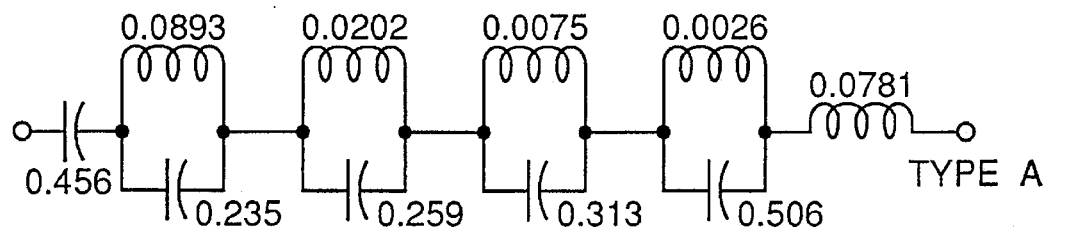
FIGS. 3 is an electrical schematic of a five-section voltage fed network.
Figure 3:
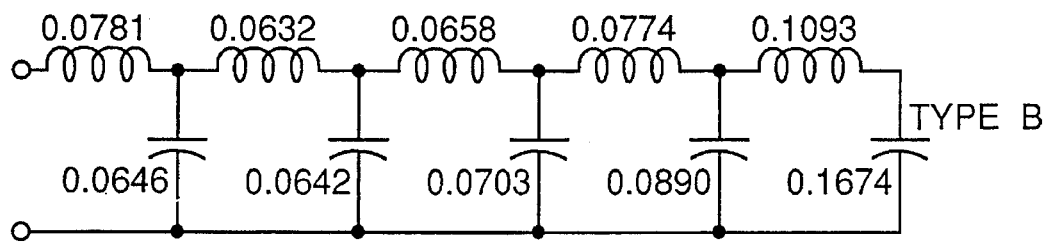
Figure 3:
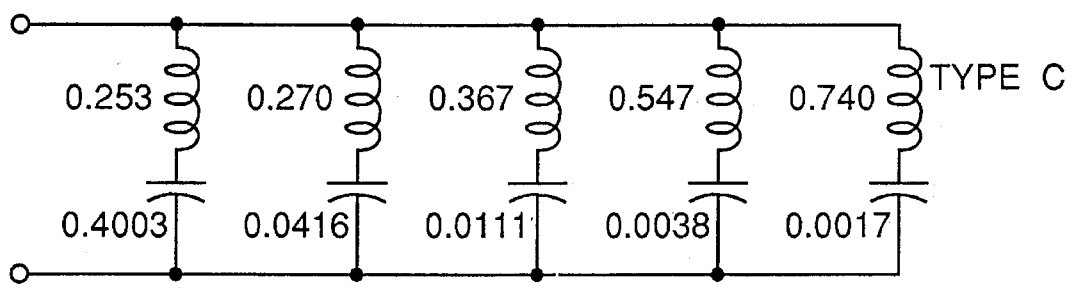
Figure 3:
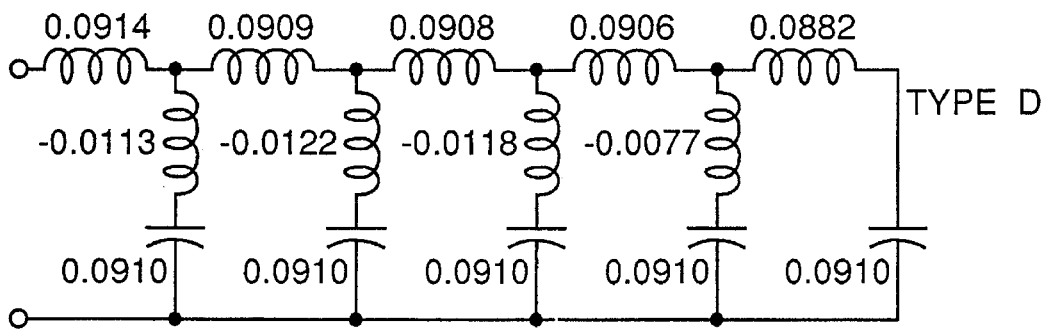
Figure 3:
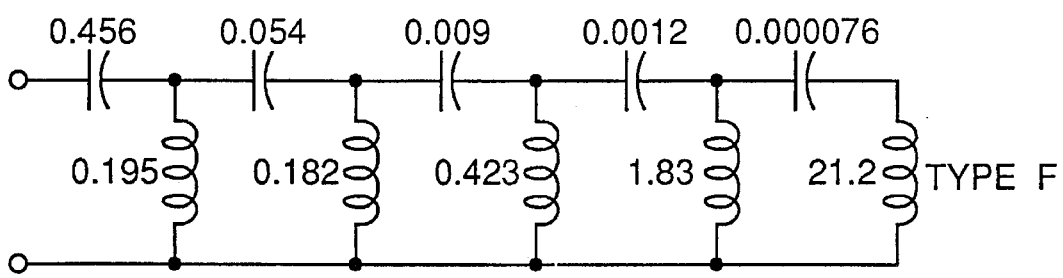

In the case of a PFN the device is configured from lumped parameter capacitive and inductive elements. There are numerous configurations including the famous Guillemin canonical forms as shown in FIG. 3 as well as numerous other configurations. The common characteristic among all capacitive energy storage PFN's is the axiomatic fact that the energy is stored initially in the capacitive elements. The sequence of operation consists of the d.c. power supply charging the primary energy store; the primary energy store is then switched into the step-up transformer which transforms the primary energy to high voltage and stores it in the PFL/PFN. The next step is to close the output switch which connects the PFL/PFN to the load. The energy in the PFL/PFN is then delivered to the load in the form of a high voltage pulse. The characteristics of the pulse are determined by the PFL/PFN and the load.

Figure 4A:
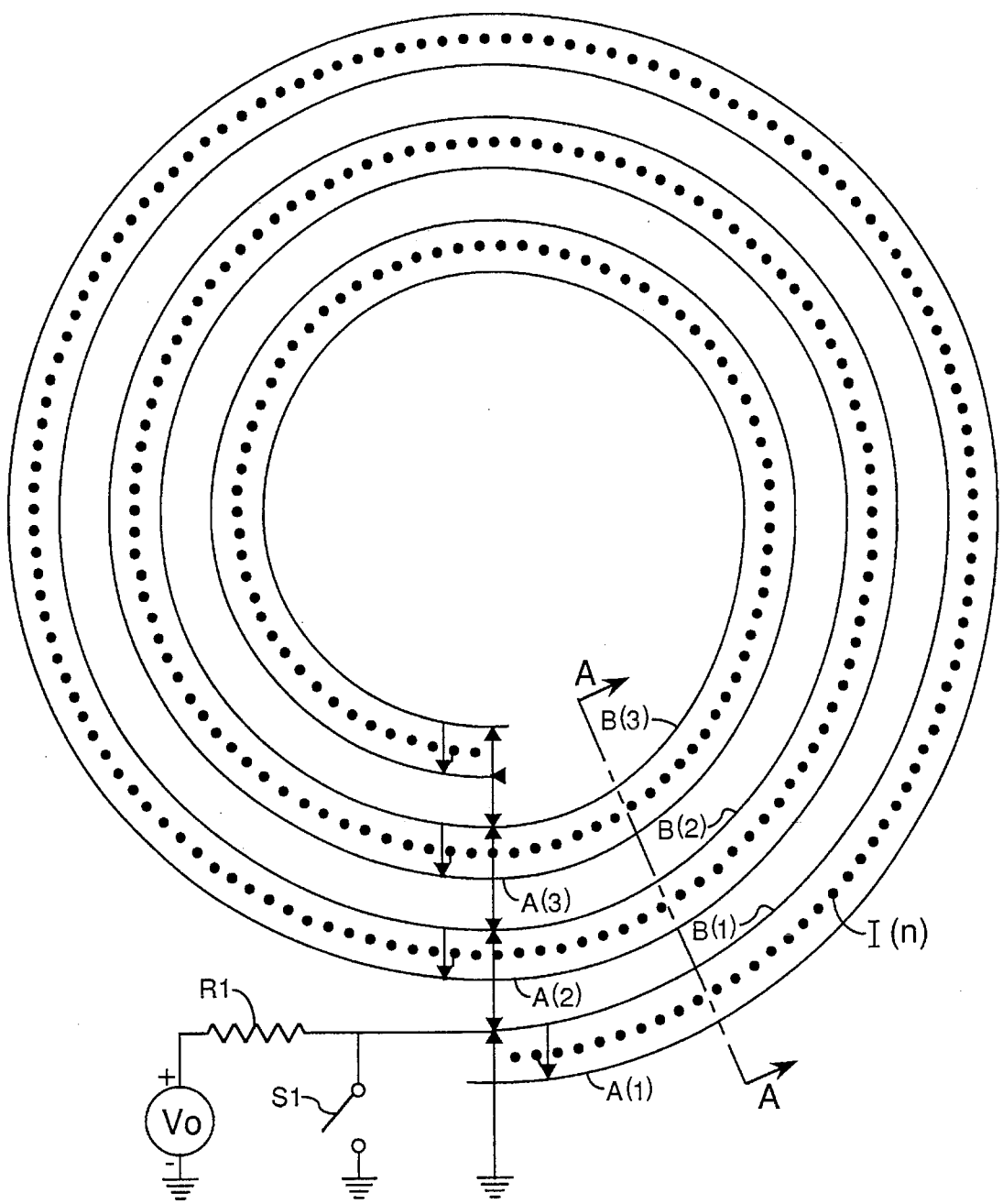
FIGS. 4A and 4B are two views of a spiral generator.
Figure 4B:
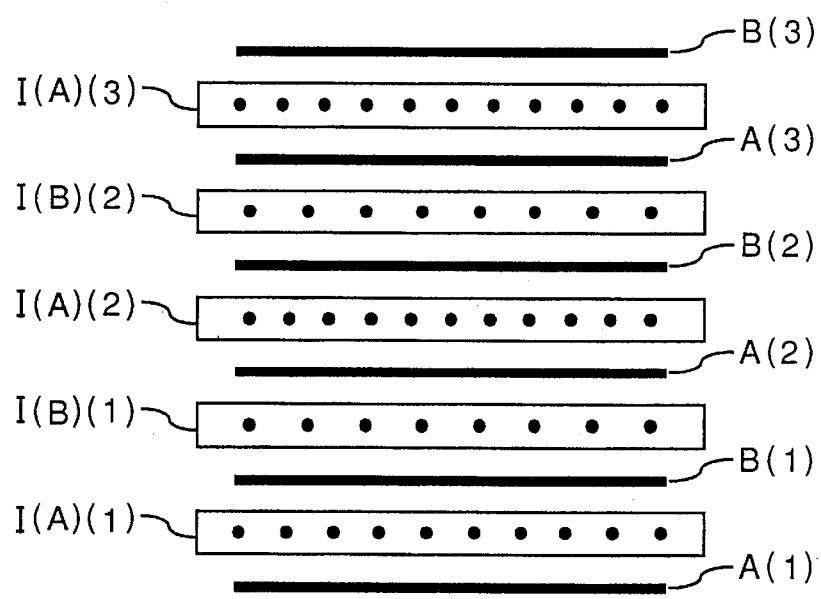

The spiral generator consists of a parallel plate transmission line, called the active line any connection between A(n) and B(n), which has been rolled into a spiral with the inclusion of an additional strip of insulation, see FIG. 4A and 4B. The additional insulation I(1), which is shown as a dotted line between the two solid lines of the parallel plate lines A(n) and B(n) where n is an integer indicating the turn number of the spiral is identical to the insulation between the parallel plate active transmission line conductors. In all figures, including FIGS. 4A and 4B the insulator layers are all labeled as "I(n)" such as I(1), I(2), . . . I(6). When it is included in the spiral it forms a second transmission line A(n) where n is an integer indicating the turn number is the spiral, the passive line, which lies sandwiched between the turns of the original active line. The device functions as follows. A charge voltage is applied to the active line any connection between A(n) and B(n) which also results in an opposite charge voltage being applied to the passive line any connection between B(n) and A(n+1). If the total voltage across the radial dimension of the spiral is tallied the result is zero. The reason being that there are as many active lines as there are passive lines across the radial dimension. Therefore, since they are charged to equal and opposite voltages the total is zero.

In the configuration shown, the outer circumference of the spiral is taken to be a ground reference potential. There is a switch located across the active line. When the switch is closed it shorts circuits the active line. This results in an inverted voltage wave being launched on the active line. There is no change to the voltage on the passive line. When the reverse voltage wave on the active line has traveled a complete round trip, i.e. from the switch on the outer circumference, the voltage on the active will be inverted. The time required for this to happen is Tc and is equal to the twice the length of the active line divided by the speed of light in the dielectric medium used in the line. Thus at this time Tc the voltage on the active line and the passive line are the same polarity, therefore the tally of radial voltage has changed from zero to a value $Vc=2 \times N \times VO$. Where N is the number of turns on each line and VO is the voltage to which the active line was originally charged. Under this condition the spiral appears to be a capacitor charged to the voltage Vc. However, as time increases the voltage on the active line begins reversing again and at the time 2 * Tc has completely reversed to the original condition. If use is made of the fully erected spiral at time Tc, in a time interval small compared to Tc, then the spiral will behave as a capacitor charged to Vc. Thus a spiral is a capacitor which can rearrange itself upon command to a high voltage configuration.

If one were able to configure practical spirals, given voltage and energy requirements, then they could be used in PFN's and other pulse power applications to advantage. The one advantage being that the high-voltage charging means could be eliminated because it is built into the spiral design.

The magnitude of the advantage is ever more important for high energy applications because the charging circuit primary store is equal in energy capacity and therefore in size to the PFN. Since both the primary energy store and the step-up transformer are eliminated by the spiral design, the size and weight saving is at least a factor of two.

Unfortunately the energy storage capacity of the conventional spiral is very restricted in terms of dimensions and does not permit practical design configurations for high energy applications. This is best explained by an example. Consider a requirement for a spiral which is charged from 10 kV and provides 10,000 joules at a voltage of 1 MV. The voltage ratio is 100 therefore the number of turns in each the active and passive lines is 50. The source voltage is 10 kV and the stress on the dielectric material is taken to be 600 kV per cm. Thus the dielectric thickness of each line is 0.0166 cm. The total radial build of the insulation is therefore 1.67 cm. Allowing for the active and passive line conductors the total spiral build will be on the order of twice the insulation thickness or about 3.35 cm. The typical relative dielectric constant for the insulation is about 3. At a stress of 600 kV per cm the energy storage is calculated as 0.0475 joules per cubic cm. Thus the total required active volume of dielectric is 210,526 cc or 0.210 cubic meters or a spiral active volume of about 0.42 cubic meters which includes allowance for the conductors as well as the insulation. The radial build of the spiral is only 3.35 cm. If we constrain the length of the spiral to 1 meter then the diameter will be forced to 4.00 meters to meet the volume requirement. If we restrict the diameter to ten times the radial build or 0.335 meters then the length becomes 11.6 meters. In either case the dimensions are awakward and the over all space utilization of the spiral in relation to the required working volume is very poor, on the order of 10 percent. What is required and what the invention provides is a method of configuring the spiral which permits an improved utilization of the total required volume. For example if we did not have the radial build restriction of 3.35 cm and were only constrained by the total active volume of 0.41 cubic meters; then a configuration of 1.25 meters outside diameter, 0.875 meters inside diameter and a length of 0.655 meters is possible. The invention does indeed make this improved configuration possible.

The conventional spiral generator is shown in FIG. 4. The spiral is formed by winding a sandwich of two conducting ribbons with two insulation ribbons. One of the insulation ribbons is placed between the conducting ribbons and the other is placed on top of the upper conducting ribbon (see FIG. 4) then the bundle is wound into a spiral. The pair of conductors with the insulation between forms a parallel plate transmission line called the "active" line.

Figure 5:
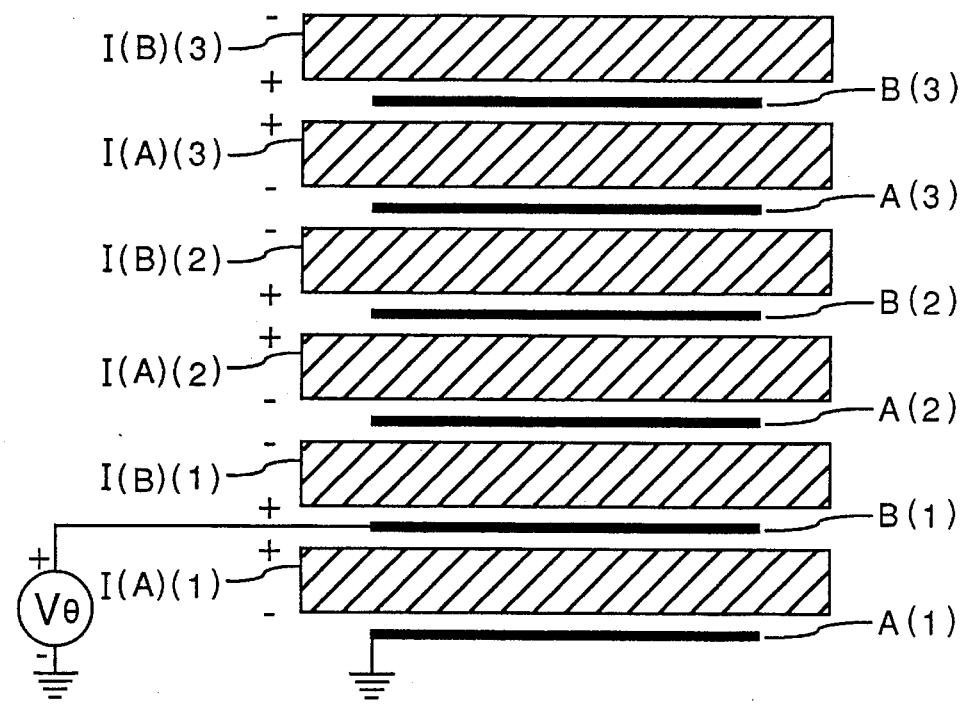
FIG. 5 is a cross sectional view of a single order spiral generator using two conductors and two insulators rolled into a spiral

The second insulation ribbon as it is incorporated in the spiral forms a second parallel plate transmission line called the "passive" line. The cross section drawing of the spiral in FIG. 5 shows the arrangement of adjacent turns. As mentioned above, FIG. 5 is intended to be a cross sectional view of three turns of a spiral generator using two parallel conductor strips (four conductor strips altogether) separated by insulator strips rolled into a spiral. This is made by winding two parallel plate transmission lines (4 conductor strips which are separated by insulators) into a spiral similar to the spiral of FIG. 4A. FIGS. 5 shows the voltage sources Vo connected to conductor B(1). When the active line is charged to a voltage, VO, it can be seen that the passive line is simultaneously charged to VO also but with the opposite polarity with respect to the radial direction. The operation of the spiral is effected by short circuiting the active line with a switch which reverses the polarity on the active line but leaves the polarity unchanged on the passive line. With the polarity reversed only on the active line the total voltage in the radial direction is now sum of the voltages on both the active and passive lines. Thus the total erected voltage is given by VO times the number of times the insulation ribbons are traversed in the radial direction. The total capacitive energy of the line is stored in the insulation. Given the electric stress, the energy per unit volume in the insulation is determined as:

$$Jcc = 4.423 \times 10^{-14} eE^2$$

Where:
Jcc=energy density in joules per cubic centimeter
e=relative dielectric constant
E=electric field in volts per centimeter The total energy is directly dependent upon the volume of the insulation, i.e. the total insulation volume in cc times Jcc. If a given total energy storage is specified then the volume of insulation is thereby determined. The total erected voltage is determined by the number of turns, therefore to meet the insulation volume requirement using the configuration of the conventional spiral of FIG. 4A, the diameter and or the length of the spiral must be adjusted accordingly. As it was shown, this leads to awkward and unreasonable dimensions. Now consider the diagram of a spiral cross section in FIG. 6. On a turn to turn basis the active line energy storage is in the dielectric which is between the points A(n) and B(n); the passive energy storage is in the dielectric between the points B(n) and A(n+1). The amount of dielectric between these two pairs of points is and must be equal for the spiral line to function correctly.

Figure 6:
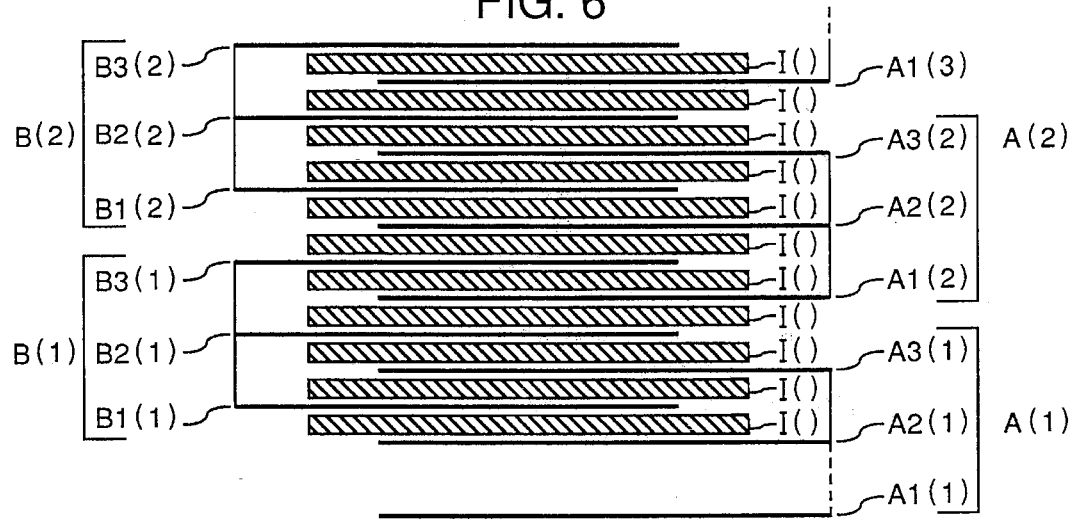
FIG. 6 is a third order spiral formed by rolling two groups of conductors sandwiched between each other and a plurality of insulator strips and rolled into a spiral.

The invention provides for the introduction of dielectric material and conductors into the spiral configuration which adds equal amounts of dielectric between the two pairs of points on a per turn basis. The total energy storage per turn of the spiral can therefore now be increased. FIG. 6 shows a third order spiral formed by these parallel transmission lines (6 conductor strips separated by insulators rolled into a spiral. The parenthesis of B1(2) shows the turn number in the spiral while the alphanumerics (A1 and B1 etc.) Identify individual conductor strips. In FIG. 6, the conductors are further divided into two groups as all the "B" conductors are electrically connected and all of the "A" conductors are electrically connected.

As shown in FIG. 6 the spiral is formed by grouping two sets of three conductors in a special manner. The two sets are indicated as A(n) and B(n) where the index n relates to the number of the turn when the sets are wound into a spiral.

Figure 7:
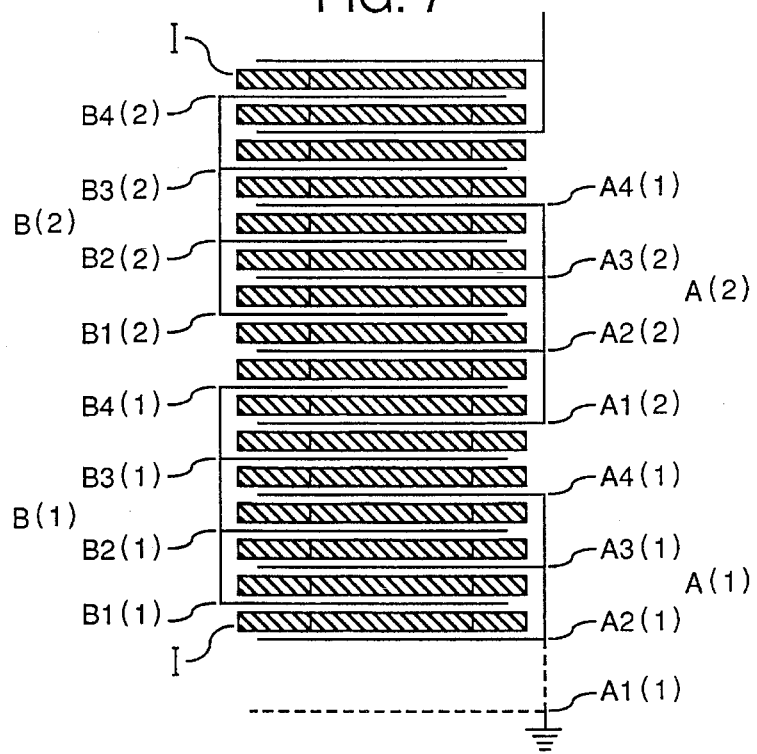
FIG. 7 depicts a cross section of a fifth order spiral which has two groups of five conductors.

Each of the three conductors in each set are connected at the edges as shown. The individual conductors are designated as A1(n), A2(n) and A3(n) for the A(n) set and B1(n), B2(n) and B3(n) for the B(n) set. This configuration of the spiral has three times the energy storage per turn as the conventional spiral of FIG. 4 given that the insulation thickness and width are the same in both cases. The insulation volume per turn is also increased by a factor of three. The active line now consists of a sandwich of four conductors and three insulations. The edges of the conductors are connected to the A(n) and B(n) points. The passive line is formed by a sandwich of four conductors and three insulations, i.e. conductors B2(n), B3(n), A1(n+1) and A2(n+1) as in FIG. 6. The active line is between A(1) and B(1) and is formed by a sandwich of four conductors and three insulations. The conductors beinging B1(n), B2(n), A2(n) and A3(n). Notice that the conductors B2(n) and A2(n) are common to both the active and passive lines. Since there are three insulations in each the active and the passive lines the structure is termed a three section spiral. The traditional spiral of FIG. 4 is a one section spiral. It can be determined by symmetry considerations that only odd section spirals are possible. If even numbers of insulations are attempted in the lines it is not possible to make the interconnections which preserve the equal energy per line requirement. That is it is not possible to have the same number of insulations in the active and passive lines if the number of insulations per line is even. An example of a five section spiral is shown in FIG. 7. The extension of the invention configuration to higher order sections is obvious.

The fabrication of the one section conventional spiral is accomplished by stacking two conductor ribbons and two insulation ribbons as shown in FIG. 4 and winding the stack into a spiral. This invention provides a means for adding energy in terms of extra insulation strips in a special manner such that the voltage performance is unchanged but the energy or impedance can be determined independently by the number of specially interleaved lines. The main advantage of this invention is a manner of interleaving the lines such that it does provide for this adjustable energy/impedance flexibility that no other prior art provides.

Connecting the edges of conductors in FIG. 6 places the conductors in parallel, therefore the voltage or potential of the conductor so connected are equal at the point of connection. The special manner of interleaving the groups provides for two sets of odd numbers of parallel transmission lines, or the same odd number of times the energy stored as in the case of the simple spiral of FIG. 4(A,B). The complexities of structuring such a configuration make it impossible to achieve even numbers of parallel lines. Thus in FIG. 6 the number of parallel lines is three and the energy advantage over a simple spiral is three. Likewise, in FIG. 7 two sets of five parallel transmission lines are formed by the special manner of interleaving and therefore the energy content is five times that of the simple spiral.

A vector inversion generator is an arrangement of transmission lines which are connected in series and are initially charged with voltages which are equal and alternate in polarity. A simple spiral generator consists of two transmission lines wound into a spiral. In the initial charge state the lines alternate in voltage along any radical path of the spiral. To activate or erect the spiral generator the voltage on one of the lines is reversed by a short circuit switch, this causes the voltage to reverse on that line, the other line is left unchanged with the original polarity. The line which changes or reverses polarity is called the "active" line. The line which does not change is called the "passive" line. For higher order section spirals the fabrication is more complicated due to the interconnections required at the edges. In any case a margin space must be used to provide insulation integrity between the conductor and the interconnection. That is the insulation must extend beyond the conductor on the edges which are not interconnected. The major problem in the fabrication of spirals of order three and higher is making interconnections between the various conductors. The problem is similar to but more complicated than the construction of "extended foil" capacitors.

An extended foil capacitor is wound with alternate layers of conductor extended on alternate edges of the winding. After the winding process all the extended foils on each edge are soldered together to form the two capacitor terminals. This type of capacitor construction reduces the effective inductance by providing a direct path for the current from each layer of conductor to the capacitor terminal.

Third and higher order spirals require similar edge connections but in a complicated manner as indicated in FIGS. 6 and 7. The construction techniques for making the connections are however similar.

Figure 8A:
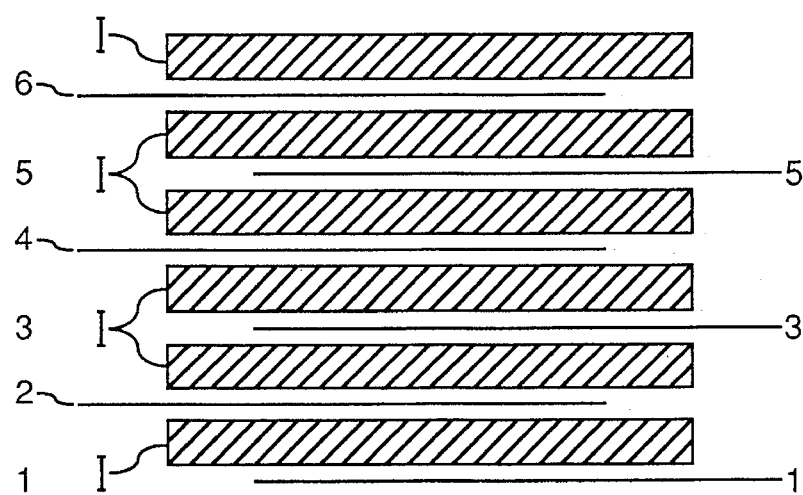
FIGS. 8A and 8B depict the two steps of winding a third order spiral.
Figure 8B:
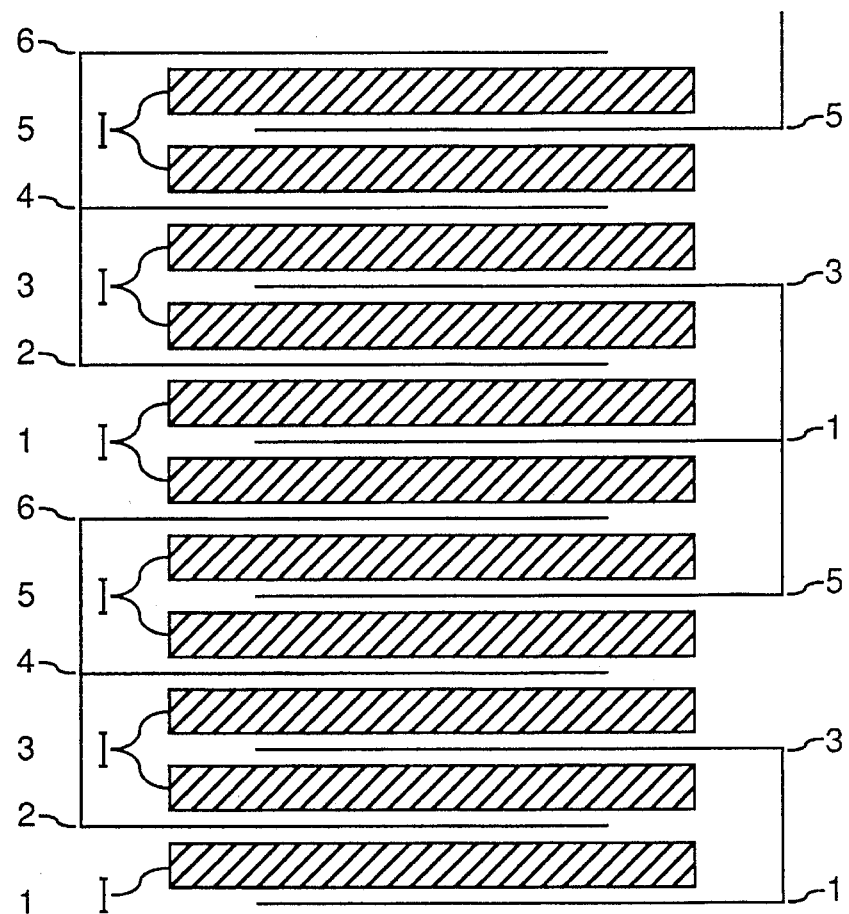

One method of construction of a spiral of order three or higher can be accomplished in a manner similar to the fabrication of the extended foil capacitor only more complicated. In FIG. 8 and FIG. 8B is an example of a sandwich of six conductors and six insulations. This sandwich is for the fabrication of a three section spiral. (It is possible, using this technique, to construct sandwiches for the fabrication of any odd number section spiral.) Three of the conductors are extended to the left and the three interleaved conductors are extended to the right as shown. This bundle can now be wound into a spiral. After the spiral is wound the edges of the conductors can be welded or soldered at the edges to make the necessary interconnections. Notice that is not possible to connect the edges before winding. After winding it is possible but difficult to solder, weld or otherwise interconnect the edges in the prescribed manner so this method is least preferred.

Figure 9A:
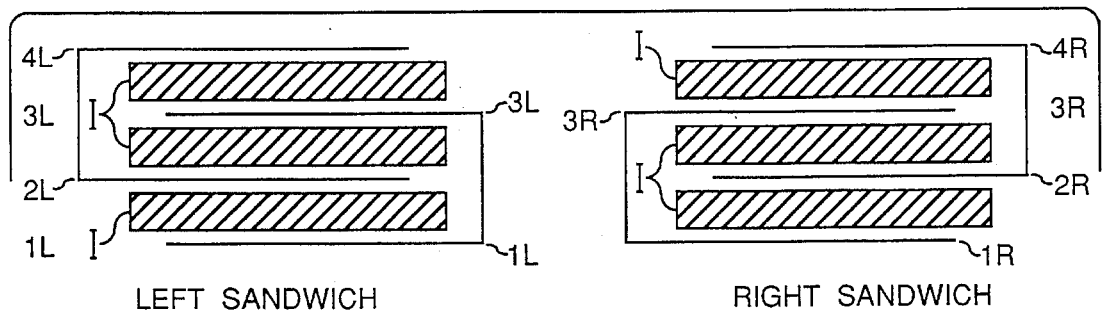
FIGS. 9A and 9B depict the two steps for a second method of winding a third order spiral.
Figure 9B:
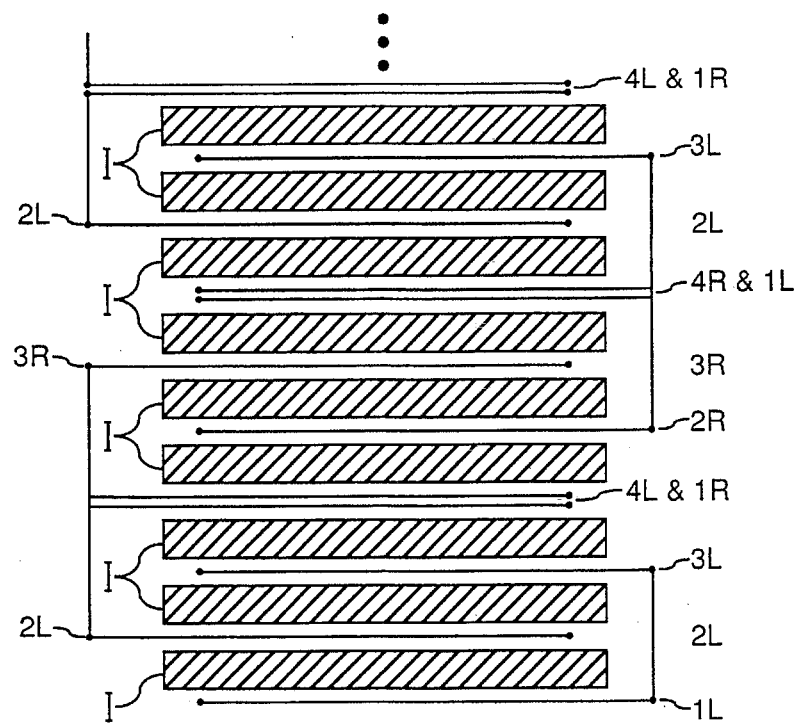

A second fabrication method is based on a two step winding process. The following example also uses a three section spiral to explain method B. The first step is to construct two sandwiches of four conductors and three insulations as shown in FIG. 9A and B. One of the sandwiches is the mirror image of the other. The conductors are welded, soldered or otherwise connected at the edges as shown. This is easily done either before the sandwiches are wound or as they are being wound as part of the first step. The second step of the process uses the two sandwiches of the first step stacked and rewound as shown in FIG. 9A. As the stack of two is rewound into the spiral, interconnections are inherently formed by the contact of the outer foils as they are wound as shown in FIG. 9B There is one extra layer of conductor in each turn of the spiral which is not electrically necessary. This extra layer is where the two sandwiches come in contact and thus become the equivalent of only one conductor. This extra layer of conductor is a small price for the simplification of the fabrication process. For an "N=odd" section spiral one first fabricates two sandwiches consisting of "N+1" conductors and "N" insulators with the edges connected on one side, one of the sandwiches being the mirror image of the other. The two sandwiches are then stacked and wound into the finished "N=odd" section spiral.

To clearly illustrate the implementation of the invention the following embodiment is given.

The performance requirements of the spiral are given as:

Source Voltage 10,000 Volts

Erected Voltage 1 MV

Total Energy 10,000 Joules

No dimension to exceed 1.5 meters

These electrical requirements are the same as given for the example in paragraph 2. The insulation stress is to be 600 kV per cm which determines an insulation thickness of 0.0166 cm. We assume that the conductor thickness is also 0.0166 cm. If we take the outside diameter as 1.25 meters and the inside diameter as 0.875 meters then the number of conductor-insulation sets between the OD and ID will be 607 maximum. We must allow a winding factor of 0.95 so the true maximum is 576. A first order spiral will have a total of 50 turns of 2 conductors and 2 insulations for a build of 3.33 cm. We must now determine what order spiral will fit the available build of 17.8 cm. The number of turns of each conductor and insulation will remain at 50. However we must increase the order of the spiral to fill the 17.8 cm build. Five sets of the 3.33 cm simple line builds to 16.65 cm which fits. Thus a fifth order spiral as shown in FIG. 7 is the configuration to use. The energy storage per unit volume in the dielectric is 0.0475 joules per cc, given by equation (1). For the 10,000 joules required the total active volume must be 0.41 cubic meters. The OD is 1.25 meters and the build is 16.65 cm so the actual ID is 91.7 cm. To accommodate the required volume of 0.41 cubic meters the active length must be 56.8 cm. To this we must add the length of the margins and some space to accommodate the interconnections. This addition increases the length by 10 cm to 66.8 cm. The final overall dimensions of the 10 kJ fifth order spiral is shown in FIG. 10. The dielectric constant of the insulation is assumed to be 3.0. The mean-length of the spiral turn is 3.4 meters for a total length of 170 meters for each conductor. The erection time is 1.13 microseconds. In order for the spiral to behave as the circuit equivalent of a capacitive energy store the energy extraction time should be held to about one tenth of the erection time or about 113 nanoseconds. The equivalent capacitance of the erected spiral is 20 nanofarads. There is no exact limit on the extraction time in relation to the erection time but the longer it is the less the erected spiral will behave as an equivalent capacitor and the less efficient the energy transfer and utilization will be. If however, the extraction time is longer than about twenty five percent of the erection time the efficiency will suffer on the order of fifty percent of more. One can design to any reasonable erection time by adjusting the total length of the spiral conductors. This may require using a lower source voltage.

Figure 10A:
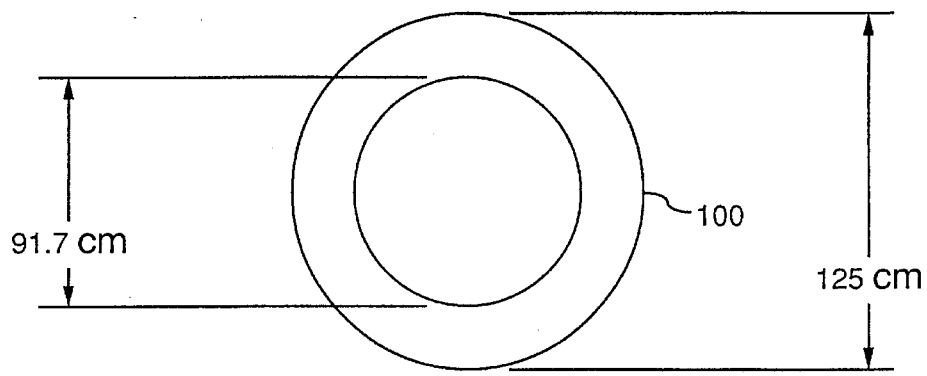
FIGS. 10A and 10B respectively illustrate a plan view and a side view of a fifth order spiral.
Figure 10B:
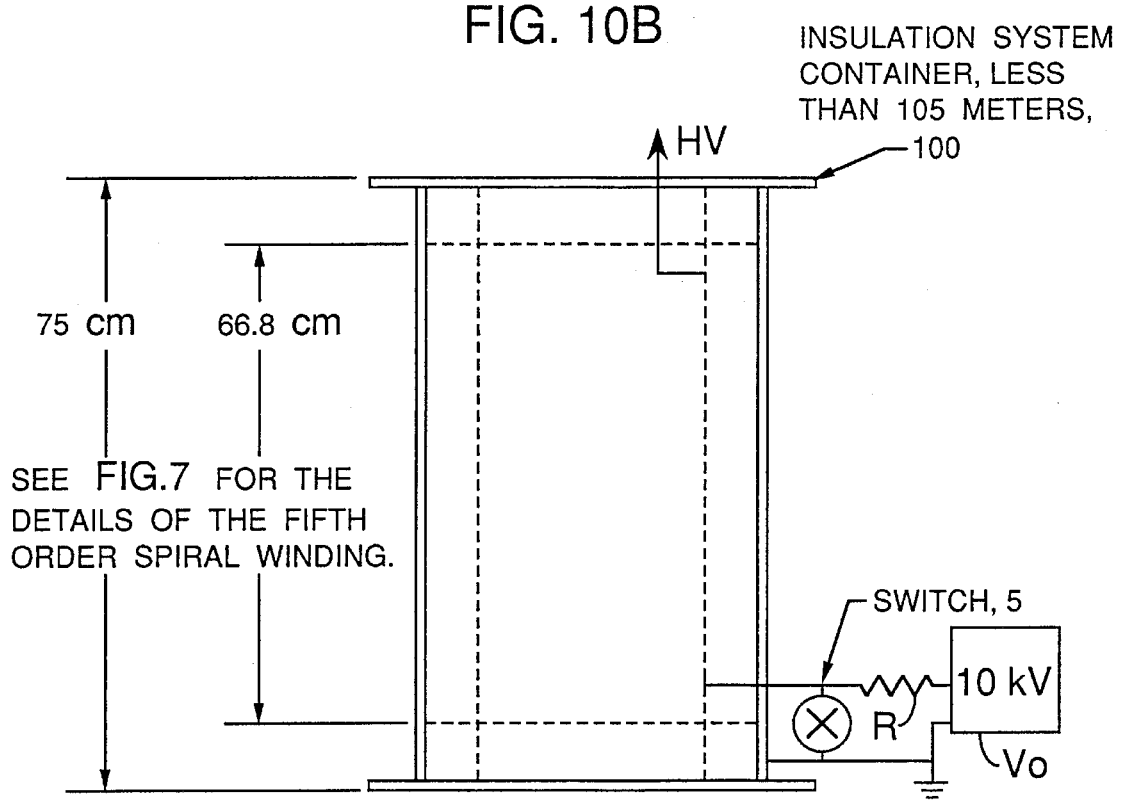

The spiral embodiment shown in FIG. 10A and 10B in practice would be enclosed in a container which provides the proper insulation system for the 1 MV operating voltage.

Such a system would typically be either liquid such as oil or a high pressure gas such as SF6 (sulphur hexafluoride). In FIG. 10 the container is indicated and has a dimension less than the specified maximum of 1.5 meters. The total gross volume of the spiral including the container is about 1.3 cubic meters. This volume is about an order of magnitude smaller than an equivalent conventional high voltage pulse power conditioning apparatus.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A multiwinding spiral generator comprising:

a first group of at least three conductor ribbons which are wound in a spiral forming several layers, said conductor ribbons in said first group all having a first edge along the entire lengths at which they are electrically connected;

at least a second group of at least three conductor ribbons which are each individually sandwiched between one of the three conductor ribbons in the first group, said conductor ribbons in said second group all having a second edge along their entire lengths along which they are electrically connected; and a means for insulating the first and second group of conductor ribbons so that none of the conductor ribbons in the first group come into contact with conductor ribbons of the second group.

2. A multiwinding spiral generator, as defined in claim 1, wherein said insulating means comprises an odd number plurality of insulator ribbons that are sandwiched between the conductor ribbons of the first and second groups of conductor ribbons.

3. A multiwinding spiral generator, as defined in claim 1, and further comprising:

a voltage source which produces an electrical voltage at a predetermined level; and a means for electrically connecting said voltage source between said first and second group of conductor ribbons.

4. A multiwinding spiral generator, as defined in claim 2, and further comprising:

a voltage source which produces an electrical voltage at a predetermined level; and a means for electrically connecting said voltage source between said first and second group of conductor ribbons.

5. A multiwinding spiral generator comprising:

a first group of an odd number of more than three conductor ribbons which are wound in a spiral forming several layers, said conductor ribbons in said first group all having a first edge along their entire lengths at which they are electrically connected;

a second group of an odd number of more than three conductor ribbons which are each individually sandwiched between one of the conductor ribbons in the first group, said conductor ribbons in said second group all having a second edge along their entire lengths along which they are electrically connected; and a means for insulating the first and second group of conductor ribbons so that none of the conductor ribbons in the first group come into contact with conductor ribbons of the second group.

6. A multiwinding spiral generator, as defined in claim 5, wherein said insulating means comprises a plurality of insulator ribbons that are sandwiched between the conductor ribbons of the first and second groups of conductor ribbons.

7. A multiwinding spiral generator, as defined in claim 5, and further comprising:

a voltage source which produces an electrical voltage at a predetermined level; and a means for electrically connecting said voltage source between said first and second group of conductor ribbons.

8. A multiwinding spiral generator, as defined in claim 6, and further comprising:

a voltage source which produces an electrical voltage at a predetermined level; and a means for electrically connecting said voltage source between said first and second group of conductor ribbons.

9. A spiral generator system comprising:

a voltage source which produces a voltage input signal with a voltage at a predetermined level and which is connected to an electrical ground;

a first conductor ribbon group which is connected to said electrical ground, and which is wound in a spiral;

a second conductor ribbon group which is connected with said voltage source to receive said voltage input signal therefrom, said second conductor ribbon group also being wound in said spiral to react as a capacitor with said first conductor ribbon group;

each conductor ribbon group compared of an odd numbered plurality of conductor ribbons and each group of said conductors being connected at their edges on one side;

a means for insulating all of the plurality of conductor ribbons so that the conductor ribbons do not come into contact with each other.

10. A spiral generator, as defined in claim 9, wherein said insulating means comprises a plurality of insulator ribbons which are sandwiched between the plurality of conductor ribbons.

11. A spiral generator, as defined in claim 9, and further comprising a means for electrically connecting said voltage source between said plurality of conductor ribbon groups.

12. A spiral generator, as defined in claim 10, and further comprising a means for electrically connecting said voltage source between said plurality of conductor ribbon groups.

* * * * *